(12) United States Patent
Davis, Jr.

(10) Patent No.: US 6,546,527 B1
(45) Date of Patent: Apr. 8, 2003

(54) METHOD AND APPARATUS FOR AUTOMATED WORST CASE DESIGNING AND ANALYZING A CIRCUIT

(76) Inventor: Henry Davis, Jr., 23427 Essex Way Ct., Southfiled, MI (US) 48034

( * ) Notice: Subject to any disclaimer, the term of this patent is extended or adjusted under 35 U.S.C. 154(b) by 0 days.

(21) Appl. No.: 09/993,825

(22) Filed: Nov. 14, 2001

(51) Int. Cl.[7] .............................................. G06F 17/50
(52) U.S. Cl. ............................................. 716/4; 716/18
(58) Field of Search ..................................... 716/4, 18

(56) References Cited

U.S. PATENT DOCUMENTS

| | | | | |
|---|---|---|---|---|
| 5,381,417 A | * | 1/1995 | Loopik et al. ............... 702/117 |
| 5,959,871 A | * | 9/1999 | Pierzchala et al. ........... 327/565 |
| 6,219,631 B1 | * | 4/2001 | Oh et al. ........................ 703/1 |
| 6,260,185 B1 | * | 7/2001 | Sasaki et al. ................. 716/18 |
| 6,353,324 B1 | * | 3/2002 | Uber et al. .................. 324/457 |
| 2001/0047506 A1 | * | 11/2001 | Houston ........................ 716/4 |
| 2002/0036540 A1 | * | 3/2002 | Kimura ...................... 330/253 |
| 2002/0094796 A1 | * | 7/2002 | Woods et al. ............... 455/260 |

* cited by examiner

Primary Examiner—Matthew Smith
Assistant Examiner—Andrea Liu
(74) Attorney, Agent, or Firm—Law Offices of John Chupa and Associates, P.C.

(57) ABSTRACT

A method and an apparatus 10 for analyzing the operation of a circuit, such as but not limited to the circuit 20, and for allowing one to quickly and efficiently create an electrical and/or electronic circuit.

14 Claims, 3 Drawing Sheets

METHOD AND APPARATUS FOR AUTOMATED WORST CASE DESIGNING AND ANALYZING A CIRCUIT

FIELD OF THE INVENTION

The present invention generally relates to a method and an apparatus for designing and analyzing a circuit and more particularly, to a method and an apparatus for efficiently, accurately, and automatically designing and analyzing a circuit by the use of an apparatus which is operable under stored program control.

BACKGROUND OF THE INVENTION

An electronic and/or electrical circuit is typically designed and analyzed by the use of information and data which may be contained in a relatively large amount and variety of books, manuals, and/or other resources. Hence, a designer, in order to properly design and analyze a circuit, is required to manually acquire and review a great many resources in order to properly create a circuit design which provides a desired operation and to properly analyze the manner in which a circuit operates.

This typical and manual approach is relatively inefficient and increases the likelihood of faulty design and operation since much of the obtained information must be interpreted by the designer. Further, this approach increases the cost and the time associated with training a circuit engineer or designer/analyzer since each trainee must become familiar with the great variety of resources and sources of circuit design and analysis material.

The present invention overcomes the previously delineated drawbacks in a new and novel manner.

SUMMARY OF THE INVENTION

It is one non-limiting advantage of the present invention to provide a method and an apparatus for analyzing and designing a circuit which overcomes some or all of the previously delineated disadvantages of prior strategies and techniques.

It is a second non-limiting advantage of the present invention to provide a method and an apparatus for quickly and efficiently allowing an electronic or electrical circuit to be analyzed and designed.

It is a third non-limiting advantage of the present invention to allow an individual to be quickly and efficiently taught to accurately design and analyze an electrical and/or electronic circuit.

It is a fourth non-limiting advantage of the present invention to allow an individual to efficiently design and analyze an electrical and/or electronic circuit while virtually eliminating developmental and debugging time.

According to a first non-limiting aspect of the present invention, a circuit assembly is provided. Particularly, the circuit assembly includes at least one circuit relationship and which uses the at least one circuit relationship to create a circuit.

According to a second non-limiting aspect of the present invention, a circuit analyzer is provided. Particularly, the circuit analyzer includes at least one circuit relationship and receives certain inputs and uses the at least one circuit relationship in combination with the received certain inputs to analyze a circuit.

According to a third non-limiting aspect of the present invention, a method for analyzing a circuit is provided. The method includes the steps of creating at least one circuit relationship; storing the created at least one circuit relationship; providing certain circuit data; and using the created at least one circuit relationship in combination with the provided certain circuit data to analyze the circuit.

These and other features, aspects, and advantages of the present invention will become apparent from a reading of the following detailed description of the preferred embodiment of the invention and by reference to the following drawings.

DETAILED DESCRIPTION OF THE PREFERRED EMBODIMENT OF THE INVENTION

Figure 1:
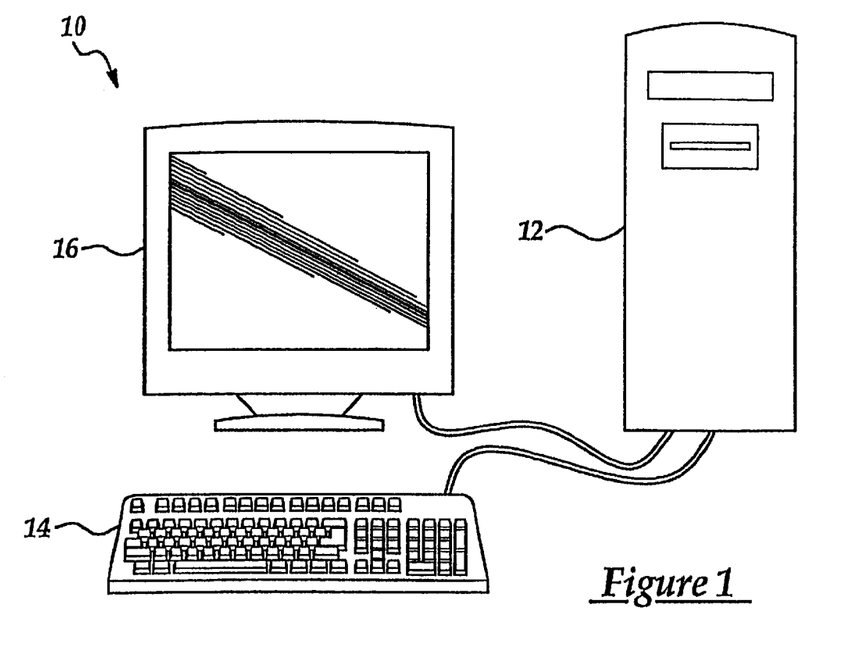
FIG. 1 is a block diagram of an apparatus which is made in accordance with the teachings of the preferred embodiment of the invention.

Referring now to FIG. 1, there is shown an apparatus 10 which is made in accordance with the teachings of the preferred embodiment of the invention. As shown; apparatus 10 includes a processor 12 which is operable under stored program control, an input device 14, such as and without limitation a keyboard, and a display or monitor assembly 16. Particularly, input device 14 and the display or monitor assembly 16 are each physically and communicatively coupled to the processor 12 and respectively allow data or information to be selectively and storable communicated to the processor 12 and allow other data or information, which is created by the processor 12, to be displayed or otherwise provided to a user of the apparatus 10. In this manner, a user of the apparatus 10 may selectively communicate with the processor 12 and the apparatus 10 in order to selectively create/design and analyze the operation of an electronic or electrical circuit.

Figure 2:
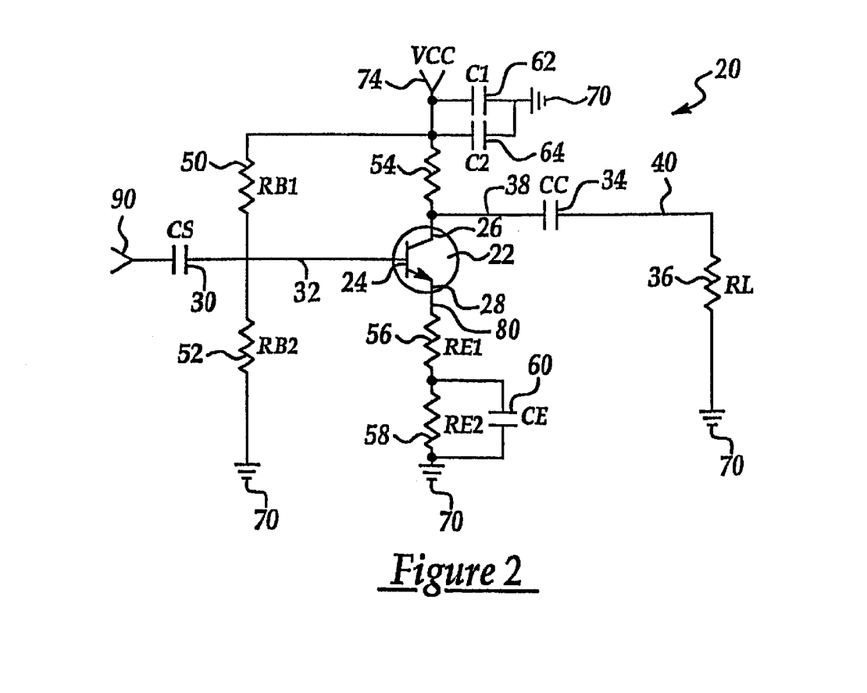
FIG. 2 is one non-limiting example of a circuit which may be designed and analyzed in accordance with the methodology of and by use of the apparatus of the preferred embodiment of the invention.
Figure 3A:
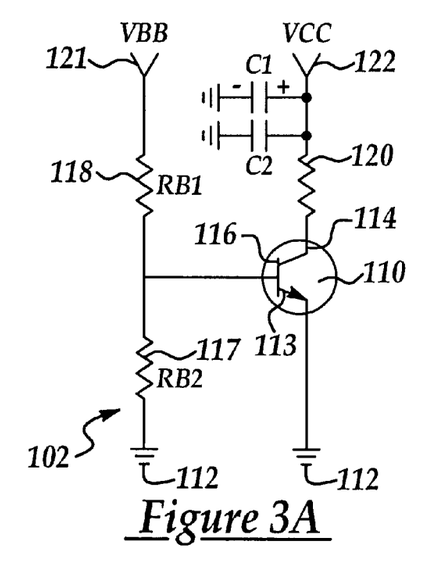
FIG. 3 is a second non-limiting example of a circuit which may be designed and analyzed in accordance with the methodology of and by use of the apparatus of the preferred embodiment of the invention.
Figure 3B:
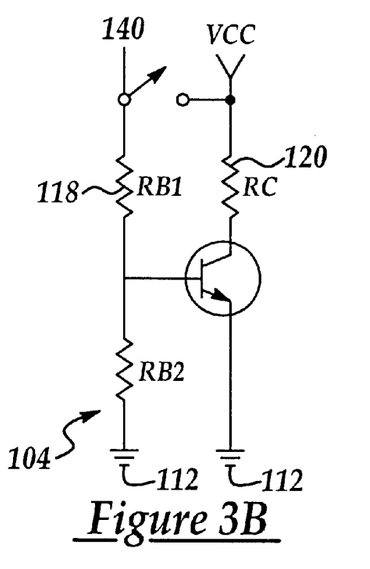
Figure 3C:
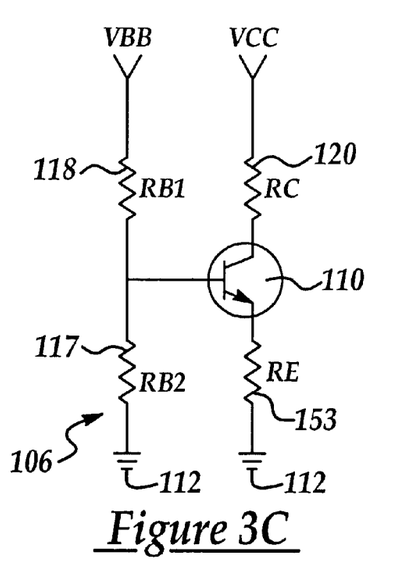
Figure 3D:
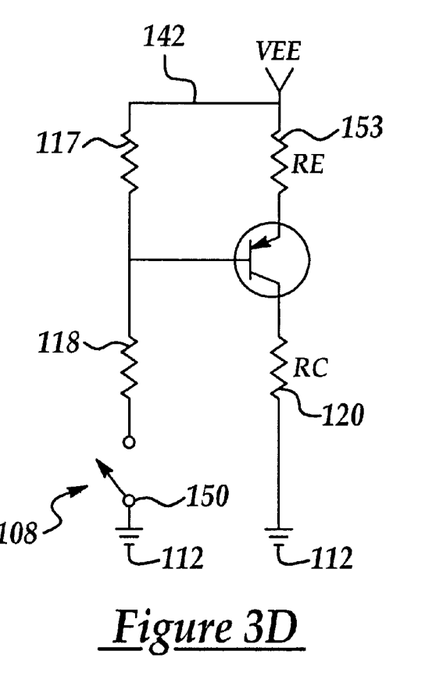
Figures 4A, 4B:
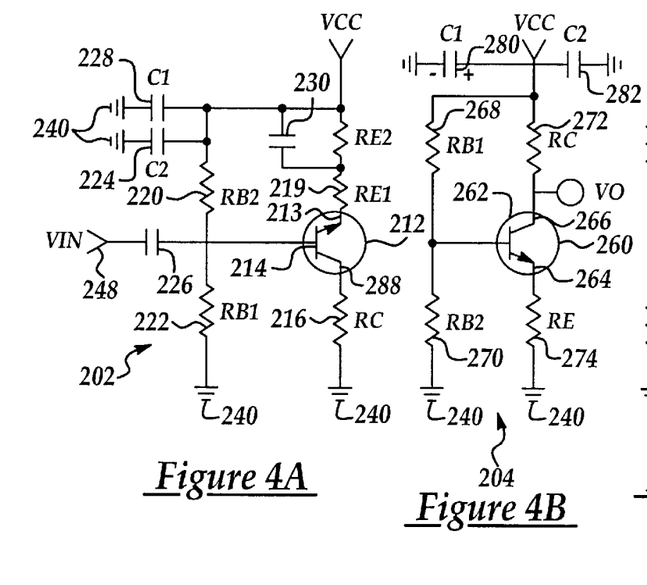
FIG. 4 is a third non-limiting example of a circuit which may be designed and analyzed in accordance with the methodology of and by use of the apparatus of the preferred embodiment of the invention.
Figure 4C:
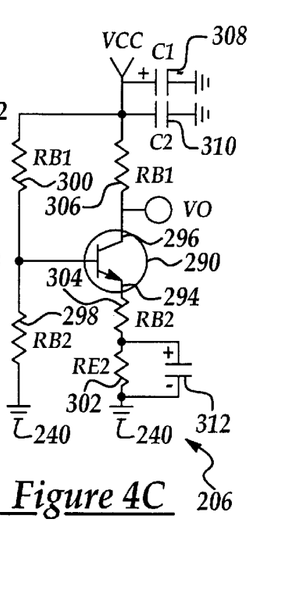
Figure 4D:
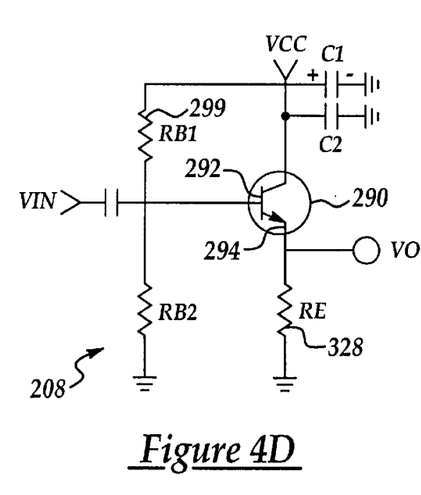
Figure 4E:
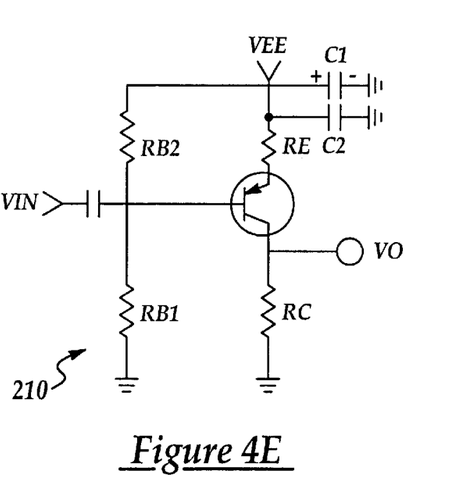

Referring now to FIG. 2, there is shown one non-limiting example of a linear amplifier circuit 20 which may be analyzed or created by the methodology and the apparatus 10 of the present invention. Particularly, as shown, linear amplifier circuit 20 includes a first transistor 22 having a base terminal 24, a collector terminal 26, and an emitter terminal 28. Further, the circuit 20 includes a capacitor 30 which is coupled to the base terminal 24 by the bus 32, and a capacitor 34 and a resistor 36. The capacitor 34 is coupled to the collector terminal 26 by the bus 38 and the resistor 36 is coupled to the capacitor 34 by the bus 40.

As is further shown in FIG. 2, the linear amplifier circuit 20 includes resistors 50, 52,54, 56, and 58, and capacitors 60, 62, and 64. Particularly, the resistor 52 is coupled to the bus 32 and to a source of electrical ground potential 70. The resistor 50 is coupled to the bus 32, to the resistor 54, and to the capacitor 64, while the capacitor 64 is coupled to the capacitor 62. Both the capacitors 62, 64 are coupled to the source of electrical ground potential 70 and to a source of voltage 74. Moreover, the capacitor 60 is coupled to the resistor 58 and the capacitor 60 and the resistor 58 are each coupled to the source of electrical ground potential 70. Further, both the resistor 58 and the capacitor 60 are coupled to the resistor 56 and the resistor 56 is coupled to the emitter terminal 28 by the bus 80. The resistor 36 is also coupled to the source of electrical ground potential 70 and the capacitor 30 is coupled to an input signal 90 one may analyze the operation of the foregoing linear amplifier circuit 20 by use of the apparatus 10 and select components which may be used to create the circuit 20 in order to achieve a desired operation by use of the apparatus 10. All of the circuits of FIG. 4 may be designed and analyzed using apparatus 10.

Design

In operation, in order to design the circuit 20, one supplies input values for the voltage which is to be applied to collector terminal 26 or "Vcc", the voltage which is applied to the base terminal 24 or "Vbb", the voltage which is applied between the emitter terminal 28 and the base terminal 24 or "Vbe", the required amount of electrical current which is to emanate from the collector terminal 26 or "Ic", the minimum amount of direct current gain or "hFEmin", the maximum tolerance of the resistors 50,52,54,56,58, and 36 or "tol", at 25 degrees Celsius, the temperature coefficient of resistance or "TC", the minimum amount of input resistance or "hiemin", the maximum amount of input resistance or "hiemax", the minimum amount of alternating current gain or "hfemin", the maximum amount of alternating current gain or "hfemax", the lowest required or desired three decibel frequency or "Fl", the minimum amount of source resistance or "RS(min)", the desired load resistance or "Rload", and the required voltage gain or "Av".

| | |
|---|---|
| Av | The required Voltage gain. |
| Bf | Forced Beta. |
| Cbe | Base - Emitter capacitance. |
| Ccb | Collector - Base capacitance. |
| Cce | Collector - Emitter capacitance. |
| Cc | Collector coupling capacitor. |
| Ce | Emitter by-pass capacitor. |
| Cs | Source coupling capacitor. |
| C1 | Power supply low-frequency by-pass capacitor. |
| C2 | Power supply high-frequency by-pass capacitor. |
| Fhi (min) | High 3db frequency due to Ci. |
| Fho (min) | High 3db frequency due to Co. |
| Fl | The low 3db Frequency. |
| Flc | Low 3db due to Cc. |
| Fle | Low 3db due to Ce. |
| Fls | Low 3db due to Cs. |
| HFEmin | The minimum D.C. current gain. |
| hfemin | The minimum A.C. current gain. |
| hfemax | The maximum A.C. current gain. |
| hiemin | The minimum input resistance. |
| hiemax | The maximum input resistance. |
| Ibmin | The minimum base current flowing in circuit. |
| Ibs | The base current required for saturation. |
| Ic | The required D.C. Collector current. |
| Icbo (max) | The maximum collector-to-base leakage current. |
| Icmin | The minimum D.C. Collector Current. |
| Icmax | The maximum D.C. Collector Current. |
| Ics | The Collector saturation Current. |
| Iemin | The minimum D.C. Emitter Current. |
| Iemax | The maximum D.C. Emitter Current. |
| Imax/Imin | The ratio of the maximum to minimum D.C. Collector Current. |
| Pce | Power dissipated between collector - emitter. |
| Pcemax | The maximum power that can be safely dissipated at a specified temperature. |
| PDF | Power Derating Factor. |
| P'r/Pr | The ratio of the maximum rated power at the operating temperature to the maximum rated power at the reference temperature. |
| Rb1 | Biasing Resistor #1. |
| Rb2 | Biasing Resistor #2. |
| Rc | The Collector d.c. load resistor. |
| Ret | Total Emitter resistance. |
| Re1 | The unby-passed portion of Emitter resistance. |
| Re2 | The by-passed portion of Emitter resistance. |
| Rja | The Thermal resistance from junction to air. |
| Rs (min) | The minimum source resistance. |
| S.R. (Rc) | Stress ratio of Rc at the operating temperature. |
| S.R. (Re) | Stress ratio of Re at the operating temperature. |
| S.R. (Rb1) | Stress ratio of Rb1 at the operating temperature. |
| S.R. (Rb2) | Stress ratio of Rb2 at the operating temperature. |
| TC | The temperature coefficient of resistance (%/C.). |
| Tjmax | The maximum rated junction temperature. |
| tol | The maximum resistor tolerance at 25 C. |
| TOL | The maximum resistor tolerance at the operating temperature. |
| To (min) | The minimum operating temperature. |
| To (max) | The maximum operating temperature. |
| Tref | The temperature at which the Resistors are rated. |
| Vbb | The base supply Voltage. |
| Vbe | The base-Emitter Voltage. |
| Vbe (off) | The voltage measured between the base and the emitter when the transistor is off. |
| Vcc | The collector supply voltage. |
| Vcemin | The minimum D.C. Collector-Emitter Voltage. |
| Vcemax | The maximum D.C. Collector-Emitter Voltage. |
| Vemin | The minimum D.C. Emitter Voltage. |
| Vemax | The maximum D.C. Emitter Voltage. |
| Ves | The Emitter Saturation Voltage. |
| Zi (min) | Minimum Input Impedance. |

When these inputs and inputs from a manufacturers' specification sheet are provided to the processor 12 by use of the input device or keyboard 14, values for the following variables or components are displayed upon the monitor or display assembly 16: a value for the resistor 54, a value for the resistor 56, total emitter resistance or "Ret", a value for the resistor 58, a value for the resistor 50, a value for the resistor 52, the minimum input impedance or "Zi (min)", a value for the capacitor 30, a value for the capacitor 34, a value for the capacitor 60, and a value for the capacitor 62. Representative values are set forth in table one below.

Summary of Linear Amplifier
Design End: A51, A101
Oct. 9, 2001

| Inputs | | | | | Power Derating Factors (PDF) | | | T.C.s | |
|---|---|---|---|---|---|---|---|---|---|
| 2N222A | | | | | | | | | |
| Vcc | 14.00 | Volts | | | Metal Film | 2.000 | %/C | +/− 0.01 | |
| Vbb | 14.00 | Volts | | | Resistor Chip | 1.818 | %/C | +/− | |
| Vbe | 0.70 | Volts@25C | | | Metal Oxide | 1.250 | %/C | | |
| Ic | 1.00 | mA | | | Carbon Film | 1.250 | %/C | | |
| hFEmin | 50.0 | at 25C | | | Carbon Composition | 1.667 | %/C | | |
| tol (+/−) | 1.0 | % | −1.0 | | PDF (%/C) = | | | | |
| | | | | | (0%−100%)/ | | | | |
| | | | | | 150−70) | | | | |
| TC | 0.0100 | %/C | =0.0100 | | −1.25 | | | | |
| hiemin | 2.0 | K | | | | | | | |
| hiemax | 8.0 | K | | | | | | | |
| hfe min | 50.00 | | | | | | | | |
| hfe max | 300.0 | | | | | | | | |
| Flmax | 60.0 | | | | | | | | |
| Rs (min) | 1.0 | K | | | | | | | |
| Rload | 5.5 | K | Rlmin = Rc | | | | | | |
| Av | 10.000 | | 1.61 | 16.1 | | | | | |
| Outputs | | | | | | | | | |
| TOL | −1.80 | | | | tol+TC*(−55−25) | | | | |
| TOL | 1.80 | | | | tol+TC*(−55−25) | | | | |
| Icmin | 0.80 | MA | | | | | | | |
| hFEmin | 25 | | | | HFE/2 | | | | |
| Vbe | 0.860 | Volts | | | Vbe+((−55−25)*(−002V/C)) | | | | |
| Vce | 8.40 | Volts | | | 0.60*Vcc | | | | |
| Ve | 1.400 | Volts | | | 0.1*Vcc | | | | |
| Ibmin | 0.0320 | mA | | | Ic/hFEmin | | | | |
| Icc | 1.1 | mA | | | Icc=1.1*(Ic1+Ic2) | | | | |
| Rc | 5.157 | K | 5.16 | | ((Vcc−Vce−Ve)/Ic)/ | | | | |
| | | | | | ((100+TOL)/100) | | | | |
| Ret | 1.653 | K | 1.650 | | (Ve/(Ib+Ic))/((100+TOL)/100) | | | | |
| Rb1 | 32.76 | K | 32.80 | | ((Vbb−Vbe−Ve)/ | | | | |
| | | | | | (ib+10*ib))/((100+TOL)/100) | | | | |
| Rb2 | 7.19 | K | 7.19 | | ((Ve+Vbe)/10*Ib))/((100+TOL)/100) | | | | |
| Re1 | 0.2376 | K | | | (Ro/Av)−(hiemin+hiemax)/ | | | | |
| | | | | | (hfemin+hfe max) | | | | |
| Re2 | 14.15 | K | | | Ret−Re1 | | | | |
| Ro | 2.662 | K | | | 1/(1Rc+1/Rl) | | | | |
| Zb (min) | 13.67 | K | | | Hiemin+hfemin*Re1min | | | | |
| Zi (min) | 4.12 | K | | | 1/(1/Rb1+1/Rb2+1/Zbmin) | | | | |
| Ze (min) | 0.0095 | K | | | (hiemin+1/(1Rb1+1/Rb2+1/Rs))/hfemax | | | | |
| Zoe | 0.210 | K | | | Zoe=Re2*(Rel+Zzemin)/ | | | | |
| | | | | | Re2+Re1+Zemin | | | | |
| Cs | 6.44 | uFmin | 21 | Vc=Vcc*1.5 | 159.2/F*0.1*Zi) | | | | |
| Cc | 4.82 | uFmin | 21 | Vc=Vcc*1.5 | 159.2/F*0.1*Rl) | | | | |
| Ce | 13.9 | uFmin | 2.1 | Vc=(Vcc*1.5) | (159.2/F*Zoe))*1.1 | | | | |
| C1 | 5.0 | uFmin | 21 | Vc=Vcc*1.5 | C1=159.2/(50 HZ*(0.05*Vcc/Icc)) | | | | |
| C2 | 0.013 | uFmin | 21 | Vc=Vcc*1.5 | C2=159.2/(20000 HZ*(0.05*Vcc/Icc)) | | | | |
| Pr(Rc) | 15.5 | mW | 63 | | Ic^2*Rc*3 | | | | |
| Pr(Re) | 5.0 | mW | 63 | | Ic^2*Re*3 | | | | |
| Pr(Rb1) | 12.6 | mW | 63 | | ((Vcc−Vbe−Ve)^2/Rb1)*3 | | | | |
| Pr(Rb2) | 2.1 | mW | 63 | | ((Ve+Vbe) 2/Rb1)*3 | | | | |

D.C. ANALYSIS: Linear Amplifier - FIG. 2 End A101

| Inputs | | | Power Derating Factors (PDF) | | | T.C.s | | |
|---|---|---|---|---|---|---|---|---|
| Vcc | 14.00 | Volts | | | | | | |
| Vbb | 14.00 | Volts | | | | | | |
| Vbe | 0.70 | Volts @ 25C | | | Metal Film | 2.000 | %/C | +/−0.0100 |
| Rc | 5.16 | K | 100.0 | mW | Resistor Chip | 1.818 | %/C | +/−0.0300 |
| Ret | 1.650 | K | 63.0 | mW | Metal Oxide | 1.250 | %/C | +/−0.0500 |
| Rb1 | 32.80 | K | 63.0 | mW | Carbon Film | 1.250 | %/C | −.03 to −.07 |
| Rb2 | 7.19 | K | 63.0 | mW | Carbon Composition | 1.667 | %/C | +/−0.188 |

-continued

| | | | | | | | Metal Film Resistors | | |
|---|---|---|---|---|---|---|---|---|---|
| | | | | | | Part NO. | Pr (mW) | Tref (C) | TC (PPM/C) |
| Tref | 70 | C | | | | | | | |
| To(min) | −55 | C | (−55 to 25C) | | | | | | |
| To(max) | 85 | C | (25 to 105C) | | | RN-55C | 100 | 125 | +/−50 |
| PDF | 2.000 | %/C | Tomax > Tref | | | RN-60C | 125 | 125 | +/−50 |
| *hFEmin | 60 | @25 C @ | 1.0 | | mA | RN-65C | | 125 | +/−50 |
| **hFEmin | 60 | @25 C @ | 1.0 | | mA | | | | |
| TJmax | 150 | C | | | | RN-55D | 125 | 70 | +/−100 |
| Rja | 0.333 | C/mW | | | | RN-60D | 250 | 70 | +/−100 |
| tol (+/−) | 1.0 | % | −1.0 | | | RN-65D | | 70 | +/−100 |
| TC | 0.0100 | %/C | −0.0100 | | | | | | |
| Outputs | | | | | | | | | |
| hFEmin | 30.00 | | | 300 | | | | | |
| TOL | −1.80 | % | TOL | −1.60 | % | tol+TC*(To−25) | | | |
| TOL | 1.60 | % | TOL | 1.60 | % | tol+TC*(To−25) | | | |
| Rcmin | 5.067 | K | Rcmin | 5.077 | K | Rc+(TOL/100)*Rc | | | |
| Remax | 1.680 | K | Remin | 1.624 | K | Re+(TOL/100)*Re | | | |
| Rb1max | 33.390 | K | Rb1min | 32.275 | K | Rb1+(TOL/100)*Rb1 | | | |
| Rb2min | 7.061 | K | Rb2max | 7.305 | K | Rb2+(TOL/100)*Rb2 | | | |
| Vbe | 0.860 | Volts | Vbe | 0.580 | Volts | Vbe+((To−25)*(−.002V/C)) | | | |
| Vth | 2.44 | Volts | Vth | 2.58 | Volts | Vth=(Vbb/Rb1+Rb2))*Rb2 | | | |
| Rth(min) | 5.828 | K | Rth(max) | 5.957 | K | Rth=Rb1*Rb2/(Rb1+Rb2) | | | |
| Ib | 0.0274 | mA | | 0.0041 | | Ib=(Vth−Vbe)/Rth+(hFE+1)*Re | | | |
| Ic(sat) | 2.075 | mA | Ic(sat) | 2.089 | mA | Vcc/(Rc+Re) | | | |
| Icmin | 0.821 | mA | Icmax | 1.215 | mA | Icmin=hFEmin*Ib | Icmax=(Vth−Vbe)/Re | | |
| Imax/Imin | 1.48 | | | | | | | | |
| Iemin | 0.848 | mA | Iemax | 1.215 | mA | Icmax | | | |
| Vcemax | 8.42 | Volts | Vcemin | 5.88 | Volts | Vcc−Ic*Rc−Ie*Re | | | |
| Vemin | 1.42 | Volts | Vemax | 1.97 | Volts | Ie*Ra | | | |
| Pce | 7.3 | mW | Pce | 7.3 | mW | (Vcc/2)^2/Rc+Re) | | | |
| *Pcemax | 525.5 | mW | *Pcemax | 105.1 | mW | Pcemax = (.8*Tjmax−To)/Rja | | | |
| P'r/Pr | 1.00 | Ratio | P'r/Pr | 0.70 | Ratio | (100% − Df * (To − Tref)/100% | | | |
| S.R.(Rc) | 0.034 | | S.R.(Rc) | 0.107 | 0.8 max | (Ic^2*Rc)/((Pr'/Pr)*Pr) | | | |
| S.R.(Re) | 0.019 | | S.R.(Re) | 0.054 | 0.8 max | (Ic^2*Re)/((Pr'/Pr)*Pr) | | | |
| S.R.(Rb1) | 0.065 | | S.R.(Rb1) | 0.092 | 0.8 max | ((Vbb−Vbe−Ve)^2/Rb1)/((Pr'/Pr)*Pr) | | | |
| S.R.(Rb2) | 0.012 | | S.R.(Rb2) | 0.020 | 0.8 max | ((Ve+Vbe)^2/Rb2)/((Pr'/Pr)*Pr) | | | |

Start: A54  *Pcemax * max, power that can be safely dissipated.

Small Signal Analysis - FIG. 2   end: A160

Inputs

| | | |
|---|---|---|
| Rc | 5.160 | K |
| Re1 | 0.238 | K |
| Re2 | 1.4200 | K |
| Rb1 | 32.80 | K |
| Rb2 | 7.19 | K |
| hIe min | 2.0 | K |
| hIe max | 8.0 | K |
| hfe min | 50.00 | |
| hfe max | 300.00 | |
| Rload | 5.50 | K |
| Rs(min) | 1.0 | K |
| Cs | 6.44 | uF |
| Cc | 4.82 | uF |
| Ce | 13.9 | uF |
| Cbe | 30.0 | pF |
| Ccb | 8.0 | pF |
| Cce | 8.0 | pF |
| tol(+/−)% | 1.0 | −1.0 |
| TC(%/c) | 0.0100 | −0.0100 |

Outputs

| | | | |
|---|---|---|---|
| To | −55 | C | |
| TOL | % | −1.80 | tol+TC*(To−25) |
| TOL | % | 1.80 | tol+TC*(To−25) |
| Rb1(min) | K | 32.2 | Rb1+(TOL/100)*Rb1 |
| Rb1(max) | K | 33.4 | Rb1+(TOL/100)*Rb1 |
| Rb2(min) | K | 7.06 | Rb2+(TOL/100)*Rb2 |
| Rb2(max) | K | 7.32 | Rb2+(TOL/100)*Rb2 |
| Rc(min) | K | 5.067 | Rc+(TOL/100)*Rc |
| Rc(max) | K | 5.253 | Rc+(TOL/100)*Rc |
| Re1(min) | K | 0.234 | Re1+(TOL/100)*Re1 |
| Re1(max) | K | 0.242 | Re1+(TOL/100)*Re1 |
| Re2(min) | K | 1.394 | Re2+(TOL/100)*Re2 |
| Re2(max) | K | 1.448 | Re2+(TOL/100)*Re2 |

-continued

| | | | |
|---|---|---|---|
| Rl(min) | K | 5.401 | Rl+(TOL/100)*Rl |
| Rl(max) | K | 5.599 | Rl(+(TOL/100)*Rl |
| Zb(min) | K | 13.686 | hlemin +hfemin * Re1min |
| Zl(min) | K | 4.069 | 1/(1/Rb1 + 1/Rb2 + 1/Zb) |
| Romin | K | 2.614 | 1/(1/Rcmin + 1/Rlmin) |
| Romax | K | 2.710 | 1/(1/Rcmax + 1/Rlmax) |
| Av(min) | | −8.50 | Vo/Vl=−(hfemin*Romin)/(hlemax+hfemin*Remax) |
| Av(max) | | −11.27 | Vo/Vl=−(hfemax*Romax)/(hlemin+hfemax*Remin) |
| Av(avg) | | −8.89 | (Avmin + Avmax)/2 |
| Zo | K | 5.16 | Zo = Rc |
| Ze(min) | K | 0.0095 | (hiemin + 1/(1/Rb1 +1/Rb2 + 1/Rs))/hfemax |
| Zoe(min) | K | 0.2071 | Re2min*(Re1min + Zemin)/(Re2min + Re1min + Zemin) |
| Fls | Hz | 4.88 | 159.2/(C*(Rs+Zl)) |
| Flc | Hz | 3.155 | 159.2/(Cc*(Rc+Rl)) |
| Fle | Hz | 55.3 | 159.2/(Ca*Zoe)    (−3.0 db) |
| Rl | K | 0.803 | 1/(1/Rs + 1/Zl)    (for hl. freq. cal.) |
| Cl | pF | 128 | Cbe + Ccb*(1−Av) |
| Fhl(min) | MHZ | 1.547 | 159.21(Cl * Rl) |
| Fho(min) | MHZ | 7.34 | 159.21(Co*Romax) |
| Start: A104 | | | |

*(Use 2*hFEmin for analysis @ 25C.)
**(Use hFEmin/5 for analysis @ 25C.)

| | |
|---|---|
| Rc− | The collect D.C. load Resistor (resistors 120). |
| Ret− | Total Emitter resistance of Emitters 28, 213, 264, and 294. |
| Re 1− | The unby-passed portion of Emitter resistance of Emitters 28, 213, 264, and 294. |
| Re 2 | The by-passed portion of Emitter resistance of Emitters 28, 213, 264, and 294. |
| Rb 1 | Biasing resistor # 1 (resistors 50, 218, 222, 268, and 300). |
| Rb 2 | Biasing resistor # 2 (resistors 52, 270, and 298). |
| Zi (min) | Minimum Input Impedance. |
| Cs | Source coupling capacitor (capacitor 30). |
| Cc | Collector coupling capacitor (capacitor 34). |
| Ce | Emitter by-pass capacitor (capacitors 60 and 12). |
| C1 | Power supply low-frequency by-pass capacity (capacitors 62, 228, 280, and 308). |
| C2 | Power supply high-frequency by-pass capacity (capacitors 64, 224, 282, and 310). |
| hFEmin | Minimum direct current gain. |
| TOL | tol+TC* (To−25), where "TOL" is the maximum tolerance of the resistors 117, 118, 120, and 153 at the operating temperature. |
| Rcmin | Rc+ (TOL/100) *Rc, where Rc is the value of resistor 120. |
| Remax | Re+ (TOL/100) *Re, where Re is the value of resistor 153. |
| Rb1max | Rb1+ (TOL/100) *Rb1, where Rb1 is the value of resistor 118. |
| Rb2min | Rb2+ (TOL/100) *Rb2, where Rb2 is the value of the resistor 117. |
| Vbe | Vbe+ ((To−25)*(−.002V/C)), where vbe is the voltage which is applied between the emitter terminal 28 and the base terminal 24. |
| Vth | Vth= (Vbb/(Rb1+Rb2))*Rb2. |
| Rth (min) | Rth=Rb1*Rb2/(Rb1+Rb2) |
| Ib | Ib= (Vth−Vbe)/(Rth+ (hFE+1)*Re) |
| Ic (sat) | Vcc/(Rc+Re) |
| Icmin | Icmin=hFEmin*Ib    Icmax= (Vth−Vbe)/Re |
| Imax/Imin | |
| Iemax | =Icmax |
| Vcemax | Vcc−Ic*Rc−Ie*Re |
| Vemin | Ie*Re |

-continued

| | |
|---|---|
| Pce | (Vcc/2)^2/(Rc+Re) |
| Pcemax | Pcemax=(.8Tjmax−To)/Pja |
| P' r/Pr | (100%−Df* (To−Tref))/100% |
| S.R. (Rc) | (Ic^2*Rc)/((Pr'/Pr)*Pr) |
| S.R. (Re) | (Ie^2*Re)/((Pr'/Pr)*Pr) |
| S.R. (Rb1) | ((Vbb−Vbe−Ve)^2/Rb1)/((Pr'/Pr)*Pr) |
| S.R. (Rb2) | ((Ve−Vbe)^2/Rb2)/((Pr'/Pr)*Pr) |
| TOL | tol+TC*(To−25) |
| Rb1 (min) | Rb1+ (−TOL/100)*Rb1 |
| Rb1 (max) | Rb1+ (TOL/100)*Rb1 |
| Rb2 (min) | Rb2+ (−TOL/100)*Rb2 |
| Rb2 (max) | Rb2+ (TOL/100)*Rb2 |
| Rc (min) | Rc+ (−TOL/100)*Rc |
| Rc (max) | Rc+ (TOL/100)*Rc |
| Re1 (min) | Re1+ (−TOL/100)*Re1 |
| Re1 (max) | Re1+ (TOL/100)*Re1 |
| Re2 (min) | Re2+ (−TOL/100)*Re2 |
| Re2 (max) | Re2+ (TOL/100)*Re2 |
| RI (min) | RI+ (−TOL/100)*RI |
| RI (max) | RI+ (TOL/100)*RI |
| Zb (min) | hiemin+hfemin*Re1min |
| Zi (min) | 1/(1/Rb1+1/Rb2+1/Zb) |
| Romin | 1/(1/Rcmin+1/RImin) |
| Romax | 1/(1/Rcmax+1/RImax) |
| Av (min) | Vo/Vi=− (hfemin*Romin)/((hiemax+hfemin*Remax) |
| Av (max) | Vo/Vi=− (hfemax*Romax)/(hiemin+hfemax*Remin) |
| Av (avg) | (Avmin+Avmax)/2 |
| Zo | Zo=Rc |
| Ze (min) | (hiemin+1/(1/Rb1+1/Rb2+1/Rs))hfemax |
| Zoe (min) | Re2min*(Re1min+Zemin)/(Re2min+Re1min+Zemin) |
| Fls | 159.2/(C*(Rs+Zi)) |
| Flc | 159.2/(Cc*(Rc+RI)) |
| Fle | 159.2/(Ce*Zoe) |
| Ri | 1/(1/Rs+1/Zi) |
| Ci | Cbe+Ccb*(1−Av) |
| Fhi (min) | 159.2/(Ci*Ri) |
| Fho (min) | 159.2/(Co*Romax) |

The foregoing design may also be conducted upon a saturated amplifier circuit which is shown, by way of example and without limitation, in FIG. 3. Four saturated amplifier circuits 102, 104, 106, and 108 are shown. All of the circuits 102, 104, 106, and 108 may be designed and analyzed using "AWCCDA" or "Automated Worst Case Circuit Design and Analysis." The first amplifier 102 includes a transistor 110 having an emitter terminal 113 which is coupled to a source of electrical ground potential 112, and further having a collector terminal 114 and a base terminal 116. The amplifier 102 further includes resistors 117, 118, and 120. Particularly, the resistor 117 is coupled to the source of electrical ground potential 112 and to the resistor 118. Both the resistors 117 and 118 are coupled to the base terminal 116. The resistor 118 is further coupled to a source of voltage 121. The resistor 120 is coupled to the collector terminal 114 and to a source of voltage 122. As shown, the third amplifier 106 is substantially similar to the first amplifier 102 except for the inclusion of a resistor 153 which is coupled to the source of electrical ground potential 112 and the emitter terminal 113 of the transistor 110 residing within this third amplifier 106, and the second amplifier 104 is substantially similar to the first amplifier 102 with the exception that the resistor 118 of the second amplifier is selectively coupled to the resistor 120 of the second amplifier 104 by a switch 140 and is not directly coupled to the source of voltage 121. The fourth amplifier 108 is substantially similar to the first amplifier 102 with the exception that the resistor 118 of the fourth amplifier 108 is directly coupled to the resistor 120 of the fourth amplifier 108 by the bus 142, the resistor 117 is selectively coupled to the source of electrical ground potential 112 by use of the switch 150, and the resistor 120 is coupled to the source of electrical ground potential 112 and the collector terminal 114 of the transistor 110 of this fourth amplifier 108. It should be realized that all of the circuits of FIG. 3 may be designed and analyzed using the apparatus 10.

Design

The following input values are required: the voltage 122 or "vcc", the voltage supplied to the base terminals 116 of each amplifier 102–108 or "Vbb" and "Vbe", the maximum collector current Icmax and the minimum d.c. currant gain hFEmin. When the above inputs are provided to processor 12 by use of the input device or keyboard 14, values for the following variables or components are displayed upon the monitor or display assembly 16: A value for the resistor 120, a value for the resistor 153, a value for the resistor 118, a value for the resistor 117. Representative values are Bet forth in the table below.

| | |
|---|---|
| Rc | The d.c. collector load resistor (120). |
| Re | The d.c. emitter resistance (153). |
| Rb1 | Biasing resistor #1 (118). |
| Rb2 | Biasing resistor #2 (117). |

Summary of Saturated Amplifier Design - FIG. 3 - Circuit 106
Oct. 1, 2001
End: A27, A80

Inputs

MPSA06

| | | | | |
|---|---|---|---|---|
| Vcc | 14.00 | Volts | | |
| Vbb | 14.00 | Volts | | |
| Vbe | 1.00 | Volts | | 2 Volts for darlington) |
| Vces | 0.00 | Volts | | (0.7 Volts for darlington) |
| Ve | 0.400 | Volts | | |
| Icmax | 5.00 | Volts | | |
| hFEmin | 85.00 | at 25C | | |
| | GOTO B15 | | | |

Outputs

| | | | | |
|---|---|---|---|---|
| hFEmin | 42.50 | | GOTO B36 | hFE/2 |
| Ibs | 0.1176 | mA | | Icmax/hFEmin |
| Rcmin | 2.720 | K | 2.720 | (Vcc−Vces−V3)/Icmax |
| Re(max) | 0.0625 | K | 0.062 | (Ve/(Ibs+Ic))/1.25 |
| Rb1(max) | 4.6314 | K | 43.00 | (Vbb−Vbe−Ve)/(Ibs+0.1)/1.25 |
| Rb2(min) | 18.667 | K | 20.000 | ((Ve+Vbe)/0.1)/.75 |
| Pr(Rc) | 204 | mW | 250 | Ic^2*Rc*3 |
| Pr(Re) | 4.91 | mW | 63 | (Ib+Ic)^2*Re*3 |
| Pr(Rb1) | 10.28 | mW | 63 | ((Vbb−Vbe−Ve)^2/Rb1)*3 |
| Pr(Rb2) | 0.32 | mW | 63 | ((Ve+Vbe)^2/Rb2)*3 |
| C1 | 11.7 | uF, min | 21 | Volts, min 1*10 6/(6.28*50*Xc) |
| C2 | 0.029 | uF, min | 21 | Volts, min 1*10 6/(6.28*20000*Xc) |
| Start: A1 | | | | |

ANALYSIS: Saturated Amplifier - FIG. 3 - Circuit 106
Oct. 1, 2001 End: A80

Inputs

MPSA06

| | | | | |
|---|---|---|---|---|
| Vcc | 14.00 | Volts | | |
| Vbb | 14.00 | Volts | | |
| Vbe | 0.70 | Volts @ 25C | | |
| Vce(sat.) | 0.00 | Volts @ 25C | | |
| Rl(min) | 2.720 | K | 250 | mW |

-continued

| | | | | | | | | |
|---|---|---|---|---|---|---|---|---|
| Re | 0.062 K | 63 | mW | | Power Derating Factors (PDF) | | | T.C.s |
| Rb1 | 43.00 K | 63 | mW | | Wirewound (H) | 0.400 | %/C | +/−0.0050 |
| Rb2 | 20.000 K | 63 | mW | | Metal Film | 2.000 | %/C | +/−0.0100 |
| Tref | 78 C | | | | Resistor Chip | 1.818 | %/C | +/−0.0300 |
| To(min) | −55 C | (−55 to 0 C) | | | Wirewound (J) | 1.000 | %/C | +/−0.0400 |
| To(max) | 100 C | (25 to 105C) | | | Wirewound (K) | 0.400 | %/C | +/−0.0400 |
| PDF | 2.000 %/C | (Tomax > Tref) | | | Metal Oxide | 1.250 | %/C | +/−0.0500 |
| *hFEmin | 85 @ 25C @ | 5.0 | mA | | Carbon Film | 1.250 | %/C | −.03 to −0.7 |
| hFEmin | 85 @ 25C @ | 5.0 | mA | | | | | |
| tol | 10 % | −10 | | | Carbon Composition | 1.667 | %/C | +/−0.1875 |
| Icbo max | 0.10 uA @ 25C | | | | T(zero) = (100%/PDF) + Tref = | | 120 | |
| Outputs | | | | | | | | |
| TC | 0.1875 %/C | −0.1875 | Default | | | | | |
| hFEmin | 42.50 | | 85.00 | | | | | |
| TOL | −25.00 | TOL | −24.06 | | tol+TC*(To−25) | | | |
| TOL | 25.00 | TOL | 24.06 | | tol+TC*(To−25) | | | |
| Vbe | 0.86 Volts | Vbe | 0.55 | Volts | Vbe+((To−25)*(−.002V/C)) | | | |
| Rcmin | 2.720 K | Rcmin | 2.720 | K | Rcmin = Rl(min) | | | |
| Remax | 0.0775 K | Remin | 0.0471 | K | ((100+TOL)/100)*Re | | | |
| Rb1min | 32.25 K | Rb1min | 32.65 | K | ((100+TOL)/100)*Rb1 | | | |
| Rb1max | 53.75 K | Rb1max | 53.35 | K | ((100+TOL)/100)*Rb1 | | | |
| Rb2min | 15.000 K | Rb2min | 15.19 | K | ((100+TOL)/100)*Rb2 | | | |
| Rb2max | 25.000 K | Rb2max | 24.81 | K | ((100+TOL)/100)*Rb2 | | | |
| Vth(min) | 3.05 Volts | Vth | 3.10 | Volts | Vth=(Vbb/(Rb1 + Rb2))*Rb2 | | | |
| Rth | 11.73 K | Rth | 11.82 | K | Rth=Rb1*Rb2/(Rb1+Rb2) | | | |
| Ics | 6.00 mA | | 5.06 | mA | Ics=(Vcc−Vces)/(Rc+Re) | | | |
| Ibs | 0.1178 mA | | 0.0595 | mA | Ibs=Ics/hFEmin | | | |
| Ibmin | 0.1533 mA | | 0.1955 | mA | Ibmin=(Vth−Vbe−Ves)/Rth | | | |
| Ibmin/Ibs | 1.3 | Ves | 3.3 | 1.20 min @ To(min) | | | | |
| Bf(max) | 32.65 | P'r/Pr | 25.88 | | Bf(max) = Ics/Ib(min) | | | |
| Ves | 0.3970 Volts | S.R.(Rc) | 0.2410 | Volts | Ves=(Ibs+Ics)*Re | | | |
| Pr'/Pr | 1.00 Ratio | S.R.(Re) | 0.40 | Ratio | (100% − Df * (To − Tref))/100 | | | |
| S.R.(Rc) | 0.2725 | S.R.(Rb1) | 0.6963 | 0.80 max | (Ics^2*Rc)/(Pr*Pr'/Pr) | | | |
| S.R.(Re) | 0.0308 | S.R.(Rb2) | 0.0478 | 0.80 max | (Ics^2*Re)/(Pr*Pr'/Pr) | | | |
| S.R.(Rb1) | 0.0799 | | 0.2120 | 0.80 max | ((Vbb−Ve−Vbe)^2/Rb1)/(Pr*Pr'/Pr) | | | |
| S.R.(Rb2) | 0.0017 | | 0.0016 | 0.80 max | ((Ve+Vbe)^2/Rb2)/(Pr*Pr'/Pr) | | | |
| Icbo(max) | | | 7.600 | uAmps | Icbo+(0.1*(To−25)) | | | |
| Vbe(off) | — mV | | 128.710 | 300 mV max | (Icbo * (Rb2*Rb2/(Rb1 + Rb2)) | | | |
| I2 | 0.084 mA | | 0.052 | mA | (Ve+Vb3)/Rb2 | | | |
| Start: A30 | | | | | | | | |

*(Use 2*hFEmin for analysis @ 25C.)

Analysis

The following inputs are required:

| | |
|---|---|
| Vcc | The collector supply voltage. |
| Vbb | The base supply voltage. |
| Vbe | The base-emitter voltage. |
| Values for the above resistors (Rc, Re, Rbi, Rb2). | |
| Tref | The temperature at which the resistors are rated, |
| Tomin and Tomax | The minimum and maximum operating temperature. |
| PDF | Power derating factor. |
| HFEmin | The minimum d.c. current gain. |
| tol | Resistor tolerance at 25 C. |
| Icbo (max) | The maximum collector-to-base leakage current. |

Referring now to FIG. 4, there is shown a linear amplifier circuit 200 which may analyzed or designed according to the teachings of this invention. Particularly, circuit 200 includes amplifiers 202, 204, 206, 208, and 210. Amplifier 202 includes a transistor 212 having a base terminal 214, an emitter terminal 213, and a collector terminal 288. The amplifier 202 further includes resistors 216, 218, 219, 220, and 222 and capacitors 224, 226, 228, and 230.

As shown, the resistor 216 is coupled to the emitter terminal 213 and to a source of electrical ground potential 240 while resistor 222 is coupled to the source of electrical ground potential 240 and to the base terminal 214. The capacitor 226 is coupled to the resistor 222, to the base terminal 214, and to a source of input voltage 244. The capacitors 224 and 228 are each coupled to the source of electrical ground potential 240 and to the resistor 220. The capacitor 228 is further coupled to a source of voltage 250. The capacitor 230 is coupled to the capacitor 228 and to the resistors 218 and 219.

The amplifier 204 includes a transistor 260 having a base terminal 262, an emitter terminal 264, and a collector terminal 266. The amplifier 204 further has resistors 268, 270, 272, and 274, and capacitors 280, 282. Particularly, the resistor 270 is coupled to the source of electrical ground potential 240 and the resistor 268 is coupled to the resistor 270, to resistor 272, and to capacitors 280, 282. The resistor 272 is coupled to the collector terminal 266 and to the resistor 268 and capacitors 280, 282, while the resistor 274 is coupled to the source of electrical ground potential 240 and to the emitter terminal 264. The voltage source 250 is coupled to the capacitors 280 and 282 and an output voltage or "Vo" is provided between the collector terminal 266 and resistor 272.

The amplifier 206 includes a transistor 290 having a collector terminal 296, a base terminal 292, and an emitter terminal 294. The amplifier 206 further includes resistors 298, 300, 302, 304, and 306, and capacitors 308, 310, and 312. Particularly, the resistor 298 is coupled to the source of electrical ground potential 240 and to the base terminal 292 while the resistor 300 is coupled to the base terminal 292, to the capacitors 308, 310, and to the voltage 250. The resistor 306 is coupled to the collector terminal 296 and to the capacitors 308, 310, the resistor 304 is coupled to the emitter terminal 294 and to the resistor 302, and the resistor 302 is coupled to the source of electrical ground potential 240 and to the capacitor 312. The capacitor 312 is further coupled to the source of electrical ground potential 240 and to the resistor 304. The capacitors 308, 310 are each coupled to the source of electrical ground potential 240 and to the voltage source 250. An output voltage or "Vo" is output between the collector terminal 296 and resistor 306.

The amplifier 208 is substantially similar to the amplifier 206 except that the resistor 306 and the capacitor 312 are eliminated and the resistors 304 and 302 are replaced with a single resistor 328. Further, the voltage 244 is applied to the base terminal 292 of the transistor 290 within this fourth amplifier 208. An output voltage or "Vo" is taken between the emitter terminal 294 of the transistor 290 within this amplifier 208 and resistor 328. The last or fifth amplifier 210 is substantially similar to the amplifier 208.

| hFEmin   | hFE/2                          |
|----------|--------------------------------|
| Ibs      | Icmax/hFEmin                   |
| Rcmin    | (Vcc−Vces−Ve) Icmax            |
| Re (max) | (Ve/(Ibs+Ic))/1.25             |
| Rb1 (max)| ((Vbb−Vbe−Ve)/(Ibs+0.1))/1.25  |
| Rb2 (min)| ((Ve+Vbe)/0.1)/.75             |
| Pr (Rc)  | IC^2*Rc*3                      |
| Pr (Re)  | (Ib+Ic)^2*Re*3                 |
| Pr (Rb1) | ((Vbb−Vbe−Ve)^2/Rb1)*3         |
| Pr (Rb2) | ((Ve+Vbe)^2/Rb2)*3             |
| C1       | 1*10^6/(6.28*50*Xc)            |
| C2       | 1*10^6/(6.28*20000*Xc)         |

Analysis

In order to conduct the analysis of this circuit 200, information from the manufacturers' specification sheet and the following input values are to be received by the processor 12: the value of the voltage 250, the voltage at the base of each of the transistors 202 or "Vbb", the voltage between the base terminal and emitter terminal of each of the transistors or "Vbe", the voltage between the collector and the emitter terminals of each of the transistors 202 or "Vces", the maximum desired or allowed electrical current which is to flow from the collector terminals of each of the transistors 202 or "Icmax", and the value for the variable "hFEmin".

Analysis

Upon receipt of these values, the following values are generated:

| HFemin   | hFEmin (To=25C)                |
|----------|--------------------------------|
| TOL      | tol+TC* (To−25)                |
| Vbe      | Vbe+((To−25)*(−.002V/C))       |
| Rcmin    | Rcmin=RI (min)                 |
| Remax    | ((100+TOL)/100)*Re             |
| Rb1min   | ((100+TOL)/100)*Rb1            |
| Rb1max   | ((100+TOL)/100)*Rb1            |
| Rb2min   | ((100+TOL)/100)*Rb2            |
| Rb2max   | ((100+TOL)/100)*Rb2            |
| Vth (min)| Vth= (Vbb/(Rb1+Rb2))*Rb2       |
| Rth      | Rth=Rb1*Rb2/(Rb1+Rb2)          |
| Ics      | Ics= (Vcc−Vces)/(Rc+Re)        |

-continued

| Ibs       | Ibs=Ics/hFEmin                   |
|-----------|----------------------------------|
| Ibmin     | Ibmin= (Vth−Vbe−Ves)/Rth         |
| Ibmin/Ibs |                                  |
| Bf (max)  | Bf (max)=Ics/Ib (min)            |
| Ves       | Ves= (Ibs+Ics)*Re                |
| P'r/Pr    | (100%−Df*(To−Tref))/100          |
| S.R. (Rc) | (Ics^2*Rc)/(Pr*Pr'/Pr)           |
| S.R. (Re) | (Ics^2*Re)/(Pr*Pr'/Pr)           |
| S.R. (Rb1)| ((Vbb−Ve−Vbe)^2/Rb1)/(Pr*Pr/Pr)  |
| S.R. (Rb2)| ((Ve+Vbe)^2/Rb2)/(Pr*Pr/Pr)      |
| Icbo (max)| Icbo+ (0.1)*(To−25)              |
| Vbe (off) | Icbo*(Rb2*Rb2/(Rb1+Rb2))         |
| hFEmin    | hFE/2                            |
| Ibs       | Icmax/hFEmin                     |
| Rcmin     | (Vcc−Vces−Ve) Icmax              |
| Re (max)  | (Ve/(Ibs+Ic))/1.25               |
| Rb1 (max) | ((Vbb−Vbe−Ve)/(Ibs+0.1))/1.25    |
| Rb2 (min) | ((Ve+Vbe)/0.1)/.75               |
| Pr (Rc)   | Ic^2*Rc*3                        |
| Pr (Re)   | (Ib+Ic)^2*Re*3                   |
| Pr (Rb1)  | ((Vbb−Vbe−Ve)^2/Rb1)*3           |
| Pr (Rb2)  | ((Ve+Vbe)^2/Rb2)*3               |
| C1        | 1*10^6/(6.28*50*Xc)              |
| C2        | 1*10^6/(6.28*20000*Xc)           |

The equations to calculate these values are set forth above.

It is to be understood that the invention is not limited to the exact construction or method which has been delineated above, but that various changes and modifications may be made without departing from the spirit and the scope of the invention as is delineated within the following claims.

What is claimed is:

1. A circuit assembly including at least one circuit relationship and which uses the at least one circuit relationship to create a circuit, wherein said circuit is designed and analyzed using data from a manufacturer specification sheet, and wherein said analysis includes performance prediction of said circuit over a temperature range of negative 55 degrees Celsius to over 100 degrees Celsius.

2. The circuit assembly of claim 1 wherein said circuit comprises a linear amplifier.

3. The circuit assembly of claim 1 wherein said circuit comprises a saturated amplifier.

4. The circuit assembly of claim 1 wherein said at least one circuit relationship comprises the ratio of minimum base current to base current required for saturation.

5. The circuit assembly of claim 1 wherein said at least one circuit relationship comprises the stress ratio of emitter resistance, collector resistance, a first biasing resistor, and a second biasing resistor at the maximum operating temperature.

6. The circuit assembly of claim 1 wherein said at least one circuit relationship comprises the voltage measured between a base and an emitter when the transistor is off.

7. The circuit assembly of claim 1 wherein said creating of said circuit takes less than two minutes and wherein developmental time and debugging of said circuit is eliminated.

8. A circuit analyzer including at least one circuit relationship and receives certain inputs and uses the at least one circuit relationship in combination with the received certain inputs to analyze a circuit, wherein said certain inputs include the voltage which is to be applied to a collector terminal, voltage to be applied to a base terminal, and voltage to be applied to an emitter terminal, and wherein said certain inputs further include temperature measurements of at least one resistor, said measurements including the average temperature at which said at least one resistor is rated, the minimum operating temperature of said at least one resistor, and the maximum operating temperature of said at least one resistor.

9. The circuit analyzer of claim 8 wherein said circuit comprises a linear amplifier.

10. The circuit analyzer of claim 8 wherein said circuit comprises a saturation amplifier.

11. A method for analyzing a circuit including the steps of:

creating at least one circuit relationship;

storing the created at least one circuit relationship;

providing certain circuit data;

providing certain values for the collector saturation current, emitter saturation voltage, minimum base current, base current required for saturation, and forced Beta;

providing certain values for ratios of minimum base current to base current required for saturation, maximum rated power at the operating temperature to the maximum rated power at the reference temperature, and voltage between a base and an emitter when the transistor is off;

providing certain values for stress ratios of emitter resistance, collector resistance, a first biasing resistor, and a second biasing resistor at the maximum operating temperature; and using the created at least one circuit relationship in combination with the provided certain circuit data to analyze the circuit.

12. The method of claim 11 wherein said step of storing the at least one circuit relationship further comprises the steps of:

providing a processor which is operable under stored program control;

providing an input device and a display monitor assembly; and communicatively coupling said processor to said keyboard and to said monitor assembly, effective to input, store, and retrieve information pertaining to said circuit analyzing.

13. A method for analyzing a circuit including the steps of:

creating at least one circuit relationship;

storing the created at least one circuit relationship;

providing a manufacturers' specification sheet;

providing certain values for voltage which is to be applied to a collector terminal, voltage which is to be applied to a base terminal, and voltage which is to be applied to an emitter terminal;

providing certain values for the required amount of electrical current which is to emanate from the collector terminal, the minimum amount of direct current gain, the average tolerance of at least one resistor, the temperature coefficient of resistance, the minimum and maximum amount of input resistance, the minimum and maximum amount of alternating current gain, the lowest required three decibel frequency, the minimum amount of source resistance, the desired amount of load resistance, and the required voltage gain; and using the created at least one circuit relationship in combination with the provided certain circuit data to analyze the circuit.

14. The method of claim 13 wherein said step of storing the at least one circuit relationship further comprises the steps of:

providing a processor which is operable under stored program control;

providing an input device and a display monitor assembly; and communicatively coupling said processor to said keyboard and to said monitor assembly, effective to input, store, and retrieve information pertaining to said circuit analyzing.

* * * * *